United States Patent
Laig-Hörstebrock et al.

(10) Patent No.: US 6,392,415 B2
(45) Date of Patent: May 21, 2002

(54) METHOD FOR DETERMINING THE STATE OF CHARGE OF LEAD-ACID RECHARGEABLE BATTERIES

(75) Inventors: Helmut Laig-Hörstebrock, Frankfurt; Eberhard Meissner, Wunstorf; Detief Brunn, Garbsen; Karl-Heinz Leiblein, Wunstorf; Dieter Übermeier, Hannover, all of (DE)

(73) Assignee: VB Autobatterie GmbH (DE)

( * ) Notice: Subject to any disclaimer, the term of this patent is extended or adjusted under 35 U.S.C. 154(b) by 0 days.

(21) Appl. No.: 09/791,108

(22) Filed: Feb. 22, 2001

(30) Foreign Application Priority Data

Feb. 23, 2000 (DE) .......................... 100 08 354

(51) Int. Cl.$^7$ ...................... H01M 10/44; G10N 27/416
(52) U.S. Cl. ........................ 324/433; 320/132
(58) Field of Search .................. 320/127, 128, 320/132, 135, 137, DIG. 21; 324/426, 427, 428, 433; 340/635, 636; 429/61, 90

(56) References Cited

U.S. PATENT DOCUMENTS

| 4,433,278 A | * | 2/1984 | Lowndes et al. |
| 4,484,130 A | * | 11/1984 | Lowndes et al. |
| 4,520,353 A | * | 5/1985 | McAuliffe |
| 6,061,638 A | * | 5/2000 | Joyce |
| 6,072,300 A | * | 6/2000 | Tsuji |
| 6,242,891 B1 | * | 6/2001 | Parsonage |

FOREIGN PATENT DOCUMENTS

DE   196 43 012 A1   4/1998

* cited by examiner

Primary Examiner—Edward H. Tso
(74) Attorney, Agent, or Firm—Schnader Harrison; Segal & Lewis LLP

(57) ABSTRACT

A method for determining the state of charge of lead-acid rechargeable batteries comprising a) substantially simultaneously measuring measured-value pairs ($U_i$, $I_i$) of the rechargeable battery voltage and current flowing at time $t_i$ over time interval dt, b) selecting a group of said measured-value pairs (Ui, $I_i$) for which only a discharge current flowed in the last time interval dt, c) varying parameters Uo, R and C such that a residual sum of squares between values $U_i$ given by formula (1)

$$U_i = Uo - R*I_i + 1/C \int I dt \qquad (1)$$

and measured values $U(t_i)$ is minimized, wherein Uo represents no-load voltage, R represents resistance and C represents capacitance, and d) calculating the state of charge of the rechargeable battery from the no load voltage obtained from formula (1).

10 Claims, 2 Drawing Sheets

METHOD FOR DETERMINING THE STATE OF CHARGE OF LEAD-ACID RECHARGEABLE BATTERIES

FIELD OF THE INVENTION

This invention relates to a method for determining the state of charge of lead-acid rechargeable batteries by estimating their no-load voltage during active operation in a vehicle.

BACKGROUND

It is desirable to determine the present state of charge of a rechargeable battery for numerous applications. If the present state of charge at a specific time is known, then the change in the state of charge can be deduced by continuous measurement of the current flowing, and by integrating it. However, the validity of the present measured value deteriorates to an ever greater extent due to the measurement uncertainty linked to this method, so that the state of charge reading must be reset from time to time using a different method.

In the case of a lead-acid rechargeable battery, assessment of the present no-load voltage of the rechargeable battery is highly suitable for this purpose since it is directly linked to the state of charge (as discharging continues, sulfuric acid is consumed from the electrolyte, and the no-load voltage of the lead-acid rechargeable battery is directly dependent on the acid density). However, to do this, the rechargeable battery is operated without interruption for at certain time, during which time the current flowing must be less than a very low threshold value. This is because the lead-acid rechargeable battery produces its no-load voltage only in the (virtually) unloaded state, while its voltage in some cases differs greatly from this when charging or discharging currents are flowing.

Depending on previous history, even in the unloaded state, it often still takes a long time for the internal state of the rechargeable battery to reach its equilibrium value, and for the voltage to reach its no-load value. Even with modern rechargeable batteries, the period of phases without any current flowing required after previous charging phases and at low temperatures is very long, in some cases from several hours up to a number of days.

Thus, in operating modes without such long phases with no current flowing, the method of measuring the no-load voltage for determining the state of charge is in general suitable only to a limited extent. One example of this is the starter rechargeable battery in a motor vehicle where, often, only stationary times of a few hours or, for example, when used in taxis, virtually no stationary times at all occur. At room temperature and above, the present no-load voltage which would be obtained if the current were switched off briefly is itself a good measure of the real no-load voltage of the rechargeable battery.

DE-19643012 A1 specifies a method in which no-load voltage values Uo from the zero crossings of the current flowing through the rechargeable battery are used to drive the voltage regulation of the generator. This method places relatively stringent demands on the measurement electronics. The flowing current generally passes through the zero point very quickly, making interpolation necessary, which can be achieved only with difficulty due to the non-linearities of the current/voltage curve at low currents.

Thus, it would be advantageous to provide a method which allows a conclusion to be drawn about the present no-load voltage of the rechargeable battery, as well as an estimate to be made of the no-load voltage while the rechargeable battery is on load, without artificially interrupting operation.

SUMMARY OF THE INVENTION

The invention relates to a method for determining the state of charge of lead-acid rechargeable batteries including a) substantially simultaneously measuring measured-value pairs $(U_i, I_i)$ of the rechargeable battery voltage and current flowing at time $t_i$ over time interval dt, b) selecting a group of the measured-value pairs $(U_i, I_i)$ for which only a discharge current flowed in the last time interval dt, c) varying parameters Uo, R and C such that a residual sum of squares between values $U_i$ given by formula (1):

$$U_i = Uo - R^* I_i + 1/C \int I dt \tag{1}$$

and measured values $U(t_i)$ is minimized, wherein Uo represents no-load voltage, R represents resistance and C represents capacitance, and d) calculating the state of charge of the rechargeable battery from the no-load voltage obtained from formula (1).

DETAILED DESCRIPTION

Figure 1:
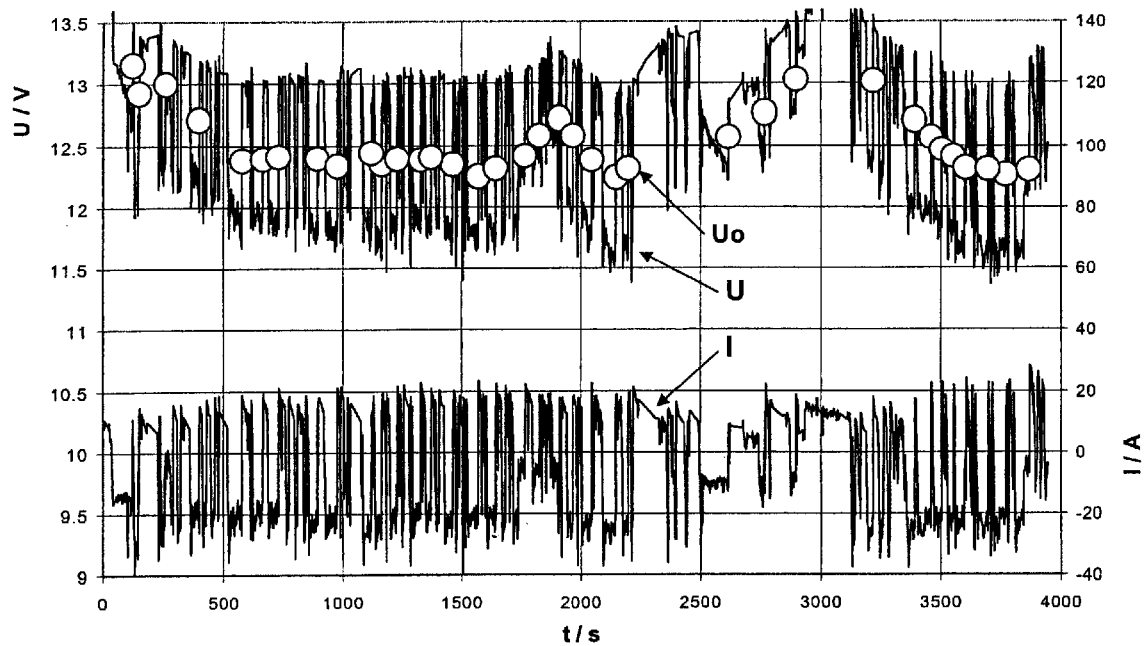
FIG. 1 is a graph of applied current and voltage response of a battery over time.

The method according to the invention essentially comprises two steps, namely, determination of the voltage Uo which the battery would have if the load were briefly disconnected and, following this, a calculation of the state of charge from the no-load voltage obtained in this way.

In the method according to the invention, a large number of measurement points are assessed, thereby allowing scattered data to be dealt with better and accuracy to be considerably improved.

The instantaneous no-load voltage is obtained by regularly measuring measured-value pairs $(U_i, I_i)$ of the present voltage and current at substantially the same time, and by using an equalization calculation to match these to a resistance relationship having a number of free parameters. One of the parameters is an approximation to the present no-load battery voltage Uo. The conventional mathematical sign rule for battery currents is used in the following text:

Charging currents for the rechargeable battery are regarded as positive currents, and discharge currents are regarded as negative currents.

In the method according to the invention, a selection is made from measured-value pairs $(U_i, I_i)$. The goal in this case is to ensure that non-equilibrium states of the electrodes which result from previous charging phases have already been dissipated since the use of measured-value pairs $(U_i, I_i)$ from such states would lead to corrupt results. In particular, the measured-value pairs $(U_i, I_i)$ which are used are those which lie in a discharge phase, that is to say, for which the present current and the current from the previous measurement are less than zero. Furthermore, care is taken to ensure that a previous charging phase (with current values greater than zero) is sufficiently far in the past.

A resistance rule in the following form has been proven for the determination, according to the invention, of the instantaneous voltage for zero current from a number of measured-value pairs ($U_i$, $I_i$):

$$U_i = U_o + R^* I_i + [a^* I_o^* \text{arcsin } h(I_i/I_o) - a^* I_i] + 1/C \int I dt. \quad (2)$$

$U_o$, $R$, $a$, $I_o$ and $C$ are in this case the parameters to be varied. $R$ and $a$ are resistance, $I_o$ and $I_i$ are current intensity, $C$ is capacitance, and $U_o$ represents the no-load voltage determined using this algorithm.

The term with the parameters $a$ and $I_o$ takes account of non-linearities and is required, in particular, in the event of major current changes. Otherwise, for simplicity, it can generally be omitted. The last part of the equation takes account of capacitive effects in the battery due to integration of the current which has flowed. This results in a simplified equation:

$$U_i = U_o - R^* I_i + 1/C \int I dt, \quad (1)$$

wherein $U_o$, $R$, $I_i$ and $C$ are the same as in equation (2). If there is any scattering in the measured values or noise is superimposed, the systematic signals are, of course, appropriately large to achieve sufficient accuracy. Determination of the correlation coefficients between current and voltage can provide information relating to this.

Thus, in the method according to the invention for estimating the present no-load voltage of a lead-acid rechargeable battery:

measured-value pairs ($U_i$, $I_i$) of the rechargeable battery voltage and the current flowing at time $t_i$ are recorded at the same time at time interval dt, with the only value pairs which are considered being those for which only a discharge current flowed in the last time interval, then, using a group of measured-value pairs ($U_i$, $I_i$) selected in such a way, parameters Uo, R and C are varied such that the residual sum of squares between the values $U_i$ given by the formula $$U_i = U_o - R^* I_i + 1/C \int I dt, \quad (1)$$

and the measured values $U(t_i)$ is minimized, finally, the state of charge of the rechargeable battery is deduced from the voltage obtained in this way. (In this case, R is resistance, C is capacitance and $U_o$ represents the no-load voltage determined using this algorithm.)

The following formula is used to work with greater accuracy:

$$U_i = U_o + R^* I_i + [a^* I_o^* \text{arcsin } h(I_i/I_o) - a^* I_i] + 1/C \int I dt. \quad (2)$$

(In this case, R and a are resistance, $I_i$ and $I_o$ are current intensity, C has the dimension capacitance and $U_o$ represents the no-load voltage determined using this algorithm.)

In a further refinement of the method, $U_o$ determined from equations (1) or (2) is compared with previous values in time, and the only value pairs (U, I) which are considered are those to which the following relationship applies:

$$dUo/dq = (Uo(t_n) - Uo(t_{n-1}))/(q(t_n) - q(t_{n-1})) < Dgr. \quad (3)$$

The limit Dgr per cell is selected from the range 6V/Qo to −6V/Qo, preferably subject to the condition Abs(Dgr) ≦1V/Qo. Qo is in this case the capacity of the battery.

It has been proven that the calculated Uo with one or two adjacent values should be averaged once again, with equation (3) being used only then as a criterion to decide whether these values Uo are suitable for use as a point of origin for determining the no-load voltage.

Alternatively, there should be a sufficiently long previous discharge phase (with a current of less than zero) before measured values are taken, to be precise such that the amount of charge $Q^-$ discharged during this period is at least equal to the amount of charge $Q^+$ introduced during a previous charging phase (with a current greater than zero). If required, an amount of charge Q may even be deliberately discharged to achieve this aim.

The amount of charge $Q^-$ required for this purpose is, from experience, not more than about 2–3% of the battery capacity. It is thus sufficient to discharge an amount of charge corresponding to $Q^{31}$ <2–3% of the battery capacity to reach the pure discharge region.

An estimate of the maximum amount of charge $Q^-$ required for this purpose from a starter rechargeable battery with a rated voltage of 12V and a battery capacity Qo is:

$$Q^- = Qo^*(U - 12V)/60V, \quad (4)$$

where U is the battery voltage measured during a short current pause.

A particularly advantageous special case according to the invention occurs when the (negative) overvoltage occurring while discharging the amount of charge $Q^-$ is on average greater than the (positive) overvoltage which occurs during the previous charging. The time interval from which the measured-value pairs ($U_i$, $I_i$) are taken is selected, for example, such that the state of charge in this period is reduced by less than 5%, and preferably by less than 2%, of the battery capacity.

The parameters obtained in carrying out the equalization calculation (including the instantaneous no-load voltage) may in general be dependent on the state of charge and the battery temperature. These parameters should, therefore, change as little as possible during the phase from which the measured-value pairs ($U_i$, $I_i$) are selected. If necessary, the duration of the phase may need to be limited appropriately. The estimation of the duration is based, for example, on the change in the state of charge which occurs and is detected by integration of the current which has flowed.

Furthermore, it is desirable for the accuracy of the method for the discharge current for the selected measured-value pairs ($U_i$, $I_i$) not to be constant, but to change as much as possible. In this case as well, an appropriate selection of the measured-value pairs ($U_i$, $I_i$) used can be made or, alternatively, changing current loads may be deliberately applied. In addition, according to the invention, the measured data detection can be synchronized to switching on and off electrical loads, in particular, pulsed loads to achieve the desired effect. The method according to the invention also applies to the starting process powered from a battery.

The selection of the measured-value pairs ($U_i$, $I_i$) used for matching to the function (1) or (2) is thus made such that the flowing (discharge) currents $I_i$ are not constant but, for example, have changes at least on the order of magnitude of about 0.01 A per Ah of battery capacity.

The measured data detection and the switching on and off of loads, in particular, with pulse-controlled loads, are synchronized in such a way that measured-value pairs ($U_i$, $I_i$) with different current intensities $I_i$ are obtained. Switching on and off loads may also be provoked, to be precise in such a way that measured-value pairs ($U_i$, $I_i$) with different current intensities $I_i$ are obtained.

The method can be supplemented by assessment of the voltage response after a previous charge, by observing the change over a period of time and then, if this is below a lower threshold value, using the present voltage measured value as an approximate value for the no-load voltage. If this condition is not yet satisfied, then the deliberate controlled discharge mentioned above is carried out. The mean current flowing during the discharge phase should not be too high, to avoid creating renewed inhomogeneities in the electrodes and in the electrolyte.

Another procedure, which is highly advantageous in practice, is for the preselection of the measurement points initially to be based on the limitation of a negative (that is to say discharge) current, and then to carry out the parameter adaptation, and then to select the values to be used, from the value Uo obtained in this way, in accordance with a criterion. That is to say, those measurement points which will finally be used to determine the state of charge are selected after their suitability has been checked.

It is thus advantageous to proceed in such a way that the no-load voltage Uo at the time $t_n$, calculated using the formula (1) is compared with that obtained for a previous time $t_{n-1}$. In this case, the only values of Uo used for calculation of the state of charge are those for which only a slight dependency has been found between the voltage Uo and the amount of charge flowing between the times $t_n$ and $t_{n-i}$. These are values for which:

$$dUo/dq = (Uo(t_n) - Uo(t_{n-1}))/(q(t_n) - q(t_{n-1})) < Dgr. \quad (3)$$

The limit value Dgr is selected from the range 6V/Qo to −6V/Qo per series-connected cell of the rechargeable battery, preferably subject to the condition Abs (Dgr)≦1V/Qo per series-connected cell. Qo is in this case the capacity of the battery.

It is also possible to select from the values Uo determined according to the invention, only those values for which the linear regression to the values Uo plotted against the converted charge has a trend which is less than Dgr, where Dgr per battery cell is selected from the range from 6V/Qo to −6V/Qo, preferably subject to the condition Abs (Dgr)<1V/Qo.

A further improvement in the accuracy of the calculation is obtained in that the state of charge value SOC $(t_o)$ obtained in this way at a specific time $t_o$ for determining the state of charge is linked to the general time t by means of other methods for determining the state of charge or else by means of methods for determining the change in the state of charge $\Delta SOC (t_o, t)$ in the time from $t_o$ to t, in which case $\Delta SOC (t_o, t)$ is advantageously calculated from the converted amount of charge determined by integration of the current flowing through the rechargeable battery.

In a further embodiment of the invention, the erroneous state of charge values SOC $(t_i)$ obtained at different times $t_i$ are linked by means of other methods for determining the erroneous state of charge values or by means of methods for determining the erroneous change in the state of charge $\Delta SOC (t_i, t_{i+1})$ in the time from $t_i$ to $t_{i+1}$, and a present state of charge value SOC is thus determined, with this value being obtained by using a minimization method, preferably the least square errors method.

The voltage values Uo obtained may also be compared with a limit value Uo-min, with undershooting being indicated and/or an action being taken. The limit Uo-min is selected such that it corresponds approximately to the equilibrium voltage of the rechargeable battery after its rated capacity has been drawn.

In summary, the procedure according to the invention is as follows:

1. Measure the voltage U(t) and the current I(t)
2. If I(t)>0, then the measurement is rejected, return to 1; otherwise
3. If the previous measurements I (t−1), I (t−2), . . . >0, return to 1; otherwise
4. Apply equation (1) or (2) to a set of value pairs U, I, and thus obtain Uo
5. (OPTIONALLY: form the average over a number of Uo obtained in this way, provided there is no measured value where I>0 inbetween)
6. Apply equation (3) and confirm whether the discharge is in the region where there is little relationship between the voltage and the amount of charge drawn; if no, this is rejected, return to 1; otherwise
7. Use Uo to calculate the state of charge via the relationship for voltage, electrolyte concentration and state of charge.

The method will be explained in more detail in the following text with reference to Examples 1 to 5 and FIGS. 1 to 4.

EXAMPLE 1

FIG. 1 shows the typical profile of the current and voltage for a vehicle battery when driving in a town. This is a six-cell lead-acid battery with a capacity of 48 Ah. The battery state of charge is approximately 70%.

The parameters in equation (1) were applied to this driving cycle and adapted with the simplification a=0 and io=0. The values obtained for all the Uo are entered as circles in FIG. 1.

Figure 2:
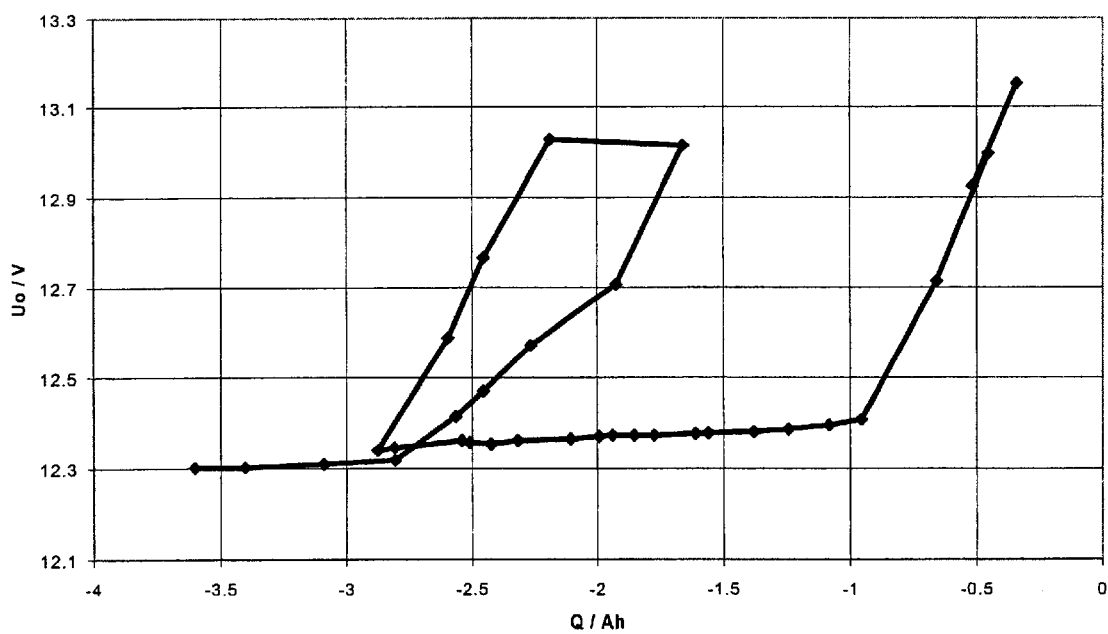
FIG. 2 is a graph of voltage versus battery capacity.
Figure 3:
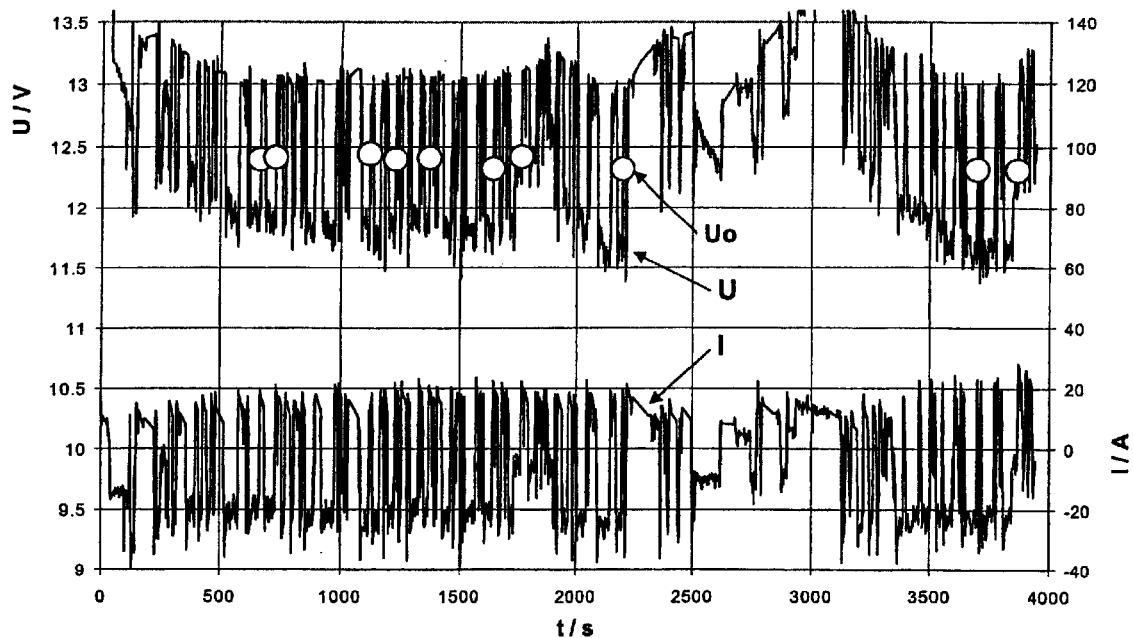
FIG. 3 is a graph of applied current and voltage response of a battery over time.

FIG. 2 shows the selection of the points Uo which may be suitable for determining the state of charge. The usable values are located where the curve has a flat profile. It is preferred that the values be averaged and the criterion of equation (3) then be applied. The values Uo which remain after applying the criterion of equation (3) with Dgr=0.1 are shown in FIG. 3.

The result shows that, in this example, the no load voltage Uo can be determined after drawing approximately 1 Ah. A no-load voltage level of approximately 12.4 V is obtained. For this specific battery, this results in a state of charge of approximately 67% from the relationship between the no-load voltage and the state of charge, which is a good match to the initial value of approximately 70% minus the approximately 1.5 Ah drawn in the meantime.

EXAMPLE 2

In operating phases where there is little dynamic variation in current, states with a changing current intensity may be provoked to make it possible to use the method according to the invention. For example, as a changing load from a battery with a rated capacity of, for example, 80 Ah, a current with an amplitude of 20 A is switched on and off, for example, every 3 seconds for a time period with a duration of, for example, 30 s and the voltage and currents are recorded using a measurement clock cycle of, for example, 0.5 s. After this period, a further current flow (for example a constant current of, for example, 5A resulting from normal operation) can be drawn until the total amount of charge drawn is approximately 0.25 Ah. The above changing load is then repeated for a further 30 s.

After evaluation of the voltage/current pairs for each changing load, a total of 6 matching parameters remain (the 5 parameters Uo, R, a, $I_o$, C from equation (2) as well as q), which must be stored in the long term. It is advantageous for this procedure to be repeated more frequently.

From two such phases with a changing load, the first stage is to deduce whether the measurement points were usable and, if yes, then to use them to estimate the no-load voltage. If the signals have higher-frequency superimposed elements, a measurement clock cycle of 0.5 s is not sufficient. In this case, it is advantageous to use a measurement clock cycle of 0.1 s, for example, for recording and to average the results, for example, every 1 s ("low-pass filter").

EXAMPLE 3

The method according to the invention is suitable in certain operating conditions to deduce the present no-load voltage $Uo(t_o)$ of the rechargeable battery at time $t_o$ and, from this, to deduce its state of charge SOC $(t_o)$ even when current is flowing to or from the rechargeable battery. However, its use may not be possible in other operating conditions since the preconditions are not satisfied.

In order to make it possible to deduce the present state of charge in these general cases at time t as well, it is within the scope of the invention for a link to be made to other methods for determining the state of charge. For example, in this case, advantageous methods include methods for determining the change in the state of charge $\Delta SOC$, for example, by integration of the current I flowing in the time from $t_o$ to t.

In this case, by way of example:

$$SOC(t)=SOC(t_o)+\Delta SOC(t_o,t) \text{ where } \Delta SOC(t_o,t)=1/Qo \int I dt.$$

EXAMPLE 4

The method according to the invention is suitable in certain operating conditions to deduce the present no-load voltage $Uo(t_o)$ of the rechargeable battery at the time $t_o$ and, from this, to deduce its state of charge SOC $(t_o)$ even when current is flowing to or from the rechargeable battery. Furthermore, as in Example 3, a link can be made to methods for determining the change in the state of charge $\Delta SOC$. Both the determination of the state of charge $SOC(t_o)$ and the determination of the change in the state of charge $\Delta SOC$ are, however, subject to a measurement error, which is composed of the uncertainty in the measurements of the voltage and time and any other error sources.

If the present state of charge SOC $(t_i)$ is determined repeatedly, for example n times, at different times $t_i$(i=1, 2, ..., n) during continuous operation and the change in the state of charge $\Delta SOC$ $(t_i, t_i+1)$ between these times is also determined, then this results in an overdefined problem.

It is within the scope of the invention to use a minimization method to calculate a state of charge and, thus, to reduce the errors mentioned above. The precision of the method is in consequence increased the greater the number of independent determinations of the state of charge that are possible. It is likewise within the scope of the invention for a link to be made to other methods for determining the state of charge, to increase the number of independent determinations of the state of charge.

EXAMPLE 5

At relatively low temperatures (<0°C.), there is a noticeable discrepancy between the calculated Uo and the no-load voltage of the rechargeable battery which would be produced after a long waiting time. However, Uo is a valuable parameter even in these cases. It has been found that Uo can be used as an early warning for a battery voltage which will soon collapse with a constant medium load.

Figure 4:
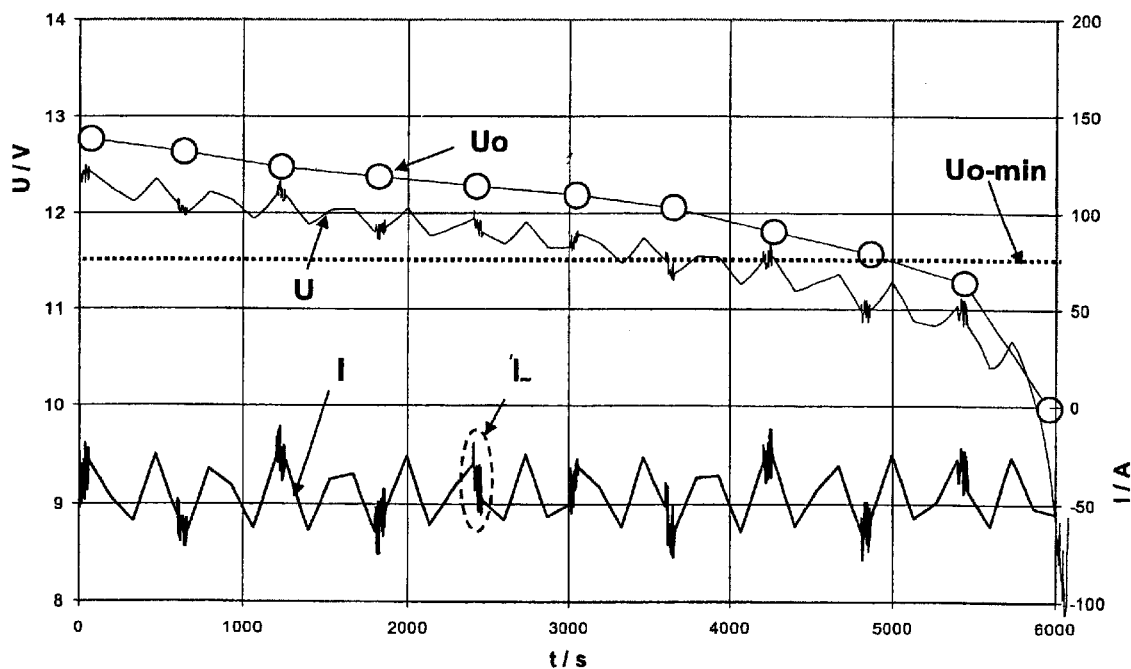
FIG. 4 is a graph of applied current and voltage response of a battery over time.

FIG. 4 shows a representative example, in which the voltage response U of a battery is plotted against the applied current I. This profile contains slow current changes as well as current changes which correspond approximately to a frequency of 1 to 0.3 Hz. One example of this is denoted I__. The relatively rapid current changes are used for evaluation. In FIG. 4, the Uo values determined in accordance with the method according to the invention are shown as large circles. If, for example, Uo falls below the value Uo—Uo min=11.5V/6 cells, the voltage will collapse very soon. It has been found that, in general, approximately 10 to 20% of the battery capacity is then still available.

What is claimed is:

1. A method for determining the state of charge of lead-acid rechargeable batteries comprising:
   substantially simultaneously measuring
   a) measured-value pairs $(U_i, I_i)$ of the rechargeable battery voltage and
   b) current flowing at time $t_i$ over time interval dt,
   selecting a group of said measured-value pairs $(U_i, I_i)$ for which only a discharge current flowed in the last time interval dt,
   varying parameters Uo, R and C such that a residual sum of squares between values $U_i$ given by formula (1)

$$U_i=Uo-R*I_i+1/C \int I dt \qquad (1)$$

and measured values $U(t_i)$ is minimized, wherein Uo represents no-load voltage, R represents resistance, $I_i$ represents current intensity and C represents capacitance, and
calculating the state of charge of the rechargeable battery from the no load voltage obtained from formula (1).

2. The method as claimed in claim 1, wherein parameters Uo, R, a, $i_o$ and C are varied such that a residual sum of squares between values $U_i$ according to formula (2)

$$U_i=Uo+R*I_i+[a*i_o*\arcsin h(I_i/i_o)-a*I_i]+1/C \int I dt. \qquad (2)$$

and measured values $U(t_i)$ is minimized, wherein Uo, R, $I_i$ and C are the same, $i_o$ is current intensity, and a represents resistance.

3. The method as claimed in claim 1, wherein selected Uo are compared with previous values in time, and wherein only values Uo which satisfy formula (3)

$$dUo/dq=(Uo(t_n)-Uo(t_{n-1}))/(q(t_n)-q(t_{n-1}))<Dgr \qquad (3)$$

are used, wherein the limit Dgr per cell is selected from the range 6V/Qo to −6V/Qo, and Qo is capacity of the battery.

4. The method as claimed in claim 1, wherein the only measured value pairs $(U_i, I_i)$ which are used are: those in which $I_i$<0 and for which the following condition has been satisfied since a last measured value with a positive current and a time interval dt with a positive contribution $Q^-$ to the state of charge: the magnitude of $Q^-$ is either greater than the magnitude of $Q^+$, the magnitude of $Q^-$ is greater than about 2% of the battery capacity, where $Q^-$ represents an (discharged) amount of charge which has been drawn since a last measurement point with a positive battery current in an uninterrupted discharge phase, and $Q^+$ is an (charged) amount of charge which has been introduced in a latest uninterrupted (charging) phase with a positive battery current.

5. The method as claimed in claim 1, wherein measurement of data and switching on and off of loads are synchronized such that measured value pairs $(U_i, I_i)$ with different current intensities $I_i$ are obtained.

6. The method as claimed in claim 1, wherein switching on and off of loads is timed such that measured value pairs $(U_i, I_i)$ with different current intensities $I_i$ are obtained.

7. The method as claimed in claim 1, wherein the state of charge SOC ($t_o$) obtained at a selected time $t_o$ is linked to general time t by other methods for determining the state of charge or by methods for determining change in the state of charge $\Delta$SOC ($t_o$,t) in a time from $t_o$ to t, wherein $\Delta$SOC ($t_o$, t) is calculated from a converted amount of charge determined by integration of current flowing through the rechargeable battery.

8. The method as claimed in claim 1, wherein state of charge values SOC ($t_i$) obtained at different times $t_i$ are linked by other methods for determining the state of charge values or by methods for determining the change in the state of charge $\Delta$SOC ($t_i$,$t_{i+1}$) in a time from $t_i$ to $t_{i+1}$, and a present state of charge value SOC is determined by using a minimization method.

9. The method as claimed in claim 1, wherein voltage values Uo obtained are compared with a limit Uo-min, and undershooting is indicated and/or an action is taken.

10. The method as claimed in claim 1, wherein a limit Uo-min is selected such that it corresponds approximately to an equilibrium voltage of the rechargeable battery after its rated capacity has been drawn.

* * * * *